(12) United States Patent
Pell et al.

(10) Patent No.: US 9,437,238 B2
(45) Date of Patent: *Sep. 6, 2016

(54) SYSTEM AND METHOD OF PROCESSING SEISMIC DATA ON A CO-PROCESSOR DEVICE

(71) Applicant: CHEVRON U.S.A. INC., San Ramon, CA (US)

(72) Inventors: Oliver Pell, London (GB); Tamas Nemeth, San Ramon, CA (US); Raymond Ergas, San Clemente, CA (US)

(73) Assignee: Chevron U.S.A. Inc., San Ramon, CA (US)

(*) Notice: Subject to any disclaimer, the term of this patent is extended or adjusted under 35 U.S.C. 154(b) by 9 days.

This patent is subject to a terminal disclaimer.

(21) Appl. No.: 14/138,457

(22) Filed: Dec. 23, 2013

(65) Prior Publication Data

US 2014/0115203 A1    Apr. 24, 2014

Related U.S. Application Data

(63) Continuation-in-part of application No. 13/597,466, filed on Aug. 29, 2012, now Pat. No. 8,825,929, which is a continuation-in-part of application No. 12/184,144, filed on Jul. 31, 2008, now Pat. No. 8,281,056.

(51) Int. Cl.
| | |
|---|---|
| *G06F 13/12* | (2006.01) |
| *G11B 20/00* | (2006.01) |
| *G01V 1/22* | (2006.01) |
| *G06F 13/38* | (2006.01) |
| *H03M 7/30* | (2006.01) |
| *G06F 3/06* | (2006.01) |

(52) U.S. Cl.
CPC .......... *G11B 20/00007* (2013.01); *G01V 1/22* (2013.01); *G06F 13/385* (2013.01); *G06F 3/0613* (2013.01); *G06F 3/0641* (2013.01); *G06F 3/0674* (2013.01); *G06F 2212/401* (2013.01); *H03M 7/30* (2013.01)

(58) Field of Classification Search
None
See application file for complete search history.

(56) References Cited

U.S. PATENT DOCUMENTS

| | | | |
|---|---|---|---|
| 4,509,150 A * | 4/1985 | Davis | 367/76 |
| 5,721,958 A | 2/1998 | Kikinis | |
| 6,594,394 B1 * | 7/2003 | Stromberg et al. | 382/232 |
| 6,996,470 B2 | 2/2006 | Kamps et al. | |
| 2002/0010819 A1 | 1/2002 | Dye | |
| 2003/0028699 A1 | 2/2003 | Holtzman et al. | |
| 2003/0176974 A1 * | 9/2003 | Baliguet et al. | 702/14 |

FOREIGN PATENT DOCUMENTS

| | | |
|---|---|---|
| KR | 10-2203-0020536 | 3/2003 |

\* cited by examiner

*Primary Examiner* — Henry Tsai
*Assistant Examiner* — Aurangzeb Hassan
(74) *Attorney, Agent, or Firm* — Marie L. Clapp

(57) ABSTRACT

A system and method for processing seismic data on one or more co-processor devices that are operatively coupled to a host computing system via a communications channel. The compression of input data transmitted to the co-processor device and/or the size of the storage provided on the co-processor device may enhance the efficiency of the processing of the data on the peripheral device by obviating a bottleneck caused by the relatively slow transfer of data between the host computing system and the co-processor device or by the relatively slow transfer of data within the co-processor device between the co-processor information storage and the co-processor.

3 Claims, 6 Drawing Sheets

SYSTEM AND METHOD OF PROCESSING SEISMIC DATA ON A CO-PROCESSOR DEVICE

This application is a divisional application of pending U.S. patent application Ser. No. 13/597,466, filed on Aug. 29, 2012, which is a continuation-in-part of U.S. Pat. No. 8,281,056 filed on Jul. 31, 2008, the contents of which are incorporated by reference in their entirety.

FIELD OF THE INVENTION

The invention relates to processing seismic data on at least one co-processor device that is operatively coupled to a host computing system.

BACKGROUND OF THE INVENTION

Generally, computing systems that make use of co-processor devices to perform computation in parallel with central processing units are known. For example, a host computing system may implement a co-processor device to perform computations while the host computing system performs other information processing and/or management functions in order to reduce the processing load on the host computing system. In some instances, co-processor devices may be configured to perform specific types of processing. For example, graphics and/or sound cards (i.e., peripheral devices) may be provided within a host computing system to perform audio and/or video processing, thereby freeing the central processor(s) of the host computing system from having to perform these tasks.

Within the field of seismic earth modeling, host computing systems and co-processor devices have been configured such that certain types of calculations made in determining information related to a seismic volume of interest are performed on the co-processor devices. Such co-processor devices may be specifically tailored to perform the requisite calculations, which may enhance the efficiency of the calculations (e.g., with time-savings, etc.). However, in such conventional configurations, bottlenecks in the processing of information on the co-processor devices may be formed by the need for communication of information between the host computing systems and the co-processor devices, and/or within the co-processor devices themselves.

SUMMARY OF THE INVENTION

One aspect of the invention relates to a method of processing data on a co-processor device that is operatively coupled to a host computing system via a communications channel. In one embodiment, the method comprises receiving a compressed set of input data from the host computing system at the co-processor device over the communications channel, wherein the input data comprises at least one of: a model of a seismic volume of interest and a set of time-varying readings of at least one seismic shot taken by an array of seismic sensors, storing the compressed set of input data to a co-processor information storage, transmitting the stored set of input data to a co-processor, implementing the co-processor to process the input data to determine a set of output data, and transmitting the set of output data to the co-processor information storage or the host computing system.

Another aspect of the invention relates to a method of processing data on a co-processor device that is operatively coupled to a host computing system via a communications channel. In one embodiment, the method comprises receiving input data from the host computing system at the co-processor device over the communications channel, wherein the input data is received by the co-processor device over the communications channel in a compressed format; storing the input data, in its compressed format, to a co-processor information storage included in the co-processor device; transmitting the input data, in its compressed format, from the co-processor information storage to a co-processor included in the co-processor device; implementing the co-processor to decompress the input data; and implementing the co-processor to process the decompressed input data according to a predetermined computational algorithm to produce output data.

Another aspect of the invention relates to a system configured to process data according to a predetermined computational algorithm. In one embodiment, the system comprises one or more system processors, system information storage, a communications channel, and a co-processor device. The one or more system processors manage processes across the system. The system information storage is in communication with the one or more system processors, and the electronic storage of information with the system information storage is managed by the one or more system processors. The communications channel is configured to provide a communication interface between a co-processor device and one or both of the one or more system processors and/or the system information storage. The co-processor device is in communication with one or both of the one or more system processors and/or the system information storage via the communications channel, and includes a co-processor information storage and a co-processor. The co-processor information storage receives information from the one or more system processors and/or the system information storage via the communications channel, the received information comprising input data that has been compressed into a compressed format, and the co-processor information storage stores the input data in the compressed format. The co-processor receives compressed input data from the co-processor information storage, the co-processor being configured to decompress the compressed input data, process the input data according to a predetermined computational algorithm to produce output data, and compress the output data.

Another aspect of the invention relates to a method for processing data on a co-processor device that is operatively coupled to a host computing system via a communications channel wherein a set of input data received by the co-processor device from the host computing system is not compressed. The co-processor device compresses the input data and stores the compressed data on the co-processor information storage. The compressed input data is transmitted to the co-processor on the co-processor device and is processed to determine a set of output data related to the presence of seismic waves in the seismic volume of interest. The set of output data may then be transmitted to the host computing system.

Another aspect of the invention relates to a method for processing data on a plurality of co-processor devices, wherein at least one of the co-processor devices is operatively coupled to a host computing system via a communications channel. The co-processor devices receive input data that may be compressed or uncompressed. If uncompressed, the input data is compressed by the co-processor device. The compressed input data is stored on the co-processor information storage of each co-processor device. The compressed input data is transferred to the co-processors which are implemented to process the input data to determine intermediate datasets. The intermediate datasets are compressed and transmitted between the co-processor devices over an interconnect device. The intermediate datasets and input datasets are processed by the co-processors. The steps are repeated until a complete set of output data is determined.

Yet another aspect of the invention relates to a system for processing data on a plurality of co-processor devices. In one embodiment, the system includes one or more system processors that manage processes across the system, system information storage in communication with the one or more system processors, a communications channel configured to provide a communication interface between at least one co-processor device and at least one of the system processors and/or the system information storage, and a plurality of co-processor devices each of which include a co-processor information storage, a co-processor, and an interconnect device configured to transmit data to other co-processor devices.

These and other objects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
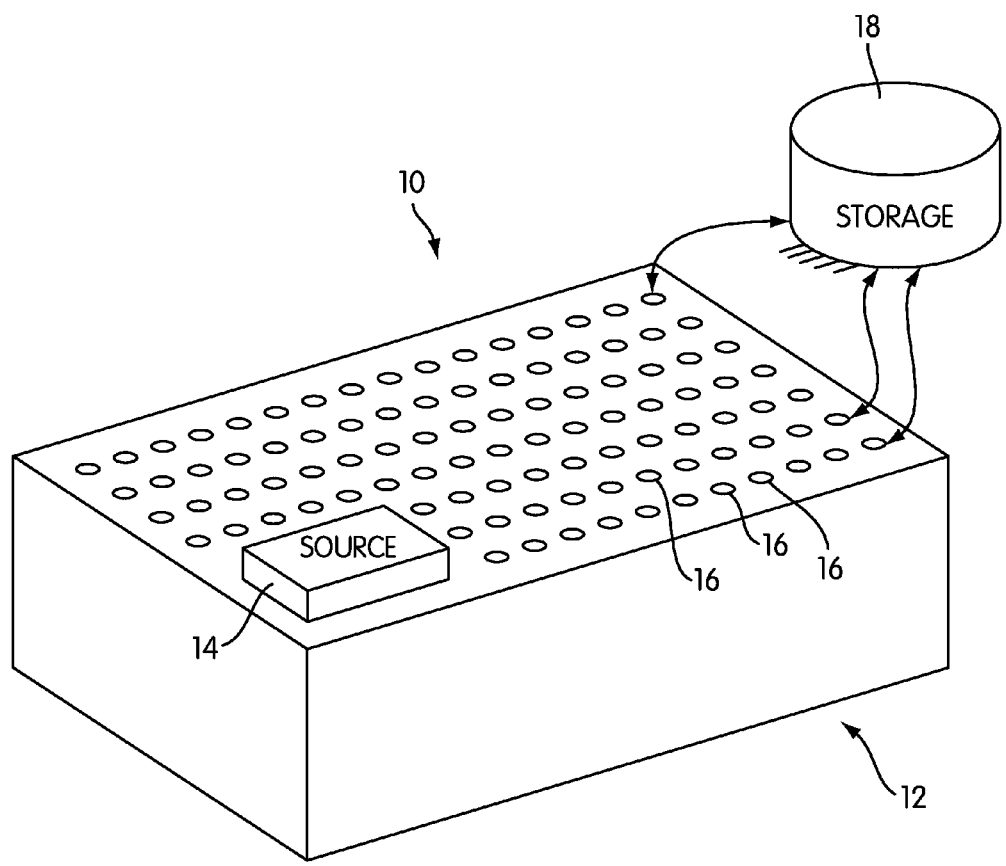
FIG. 1 illustrates a system configured to generate readings of at least one seismic shot within a volume of seismic interest, in accordance with one or more embodiments of the invention.

FIG. 1 illustrates a system 10 configured to generate readings of at least one seismic shot within a seismic volume of interest 12. System 10 records information related to the rate of propagation and/or the reflection of seismic waves within seismic volume of interest 12. From the information recorded by system 10, information related to seismic volume of interest 12 is determined. For example, a velocity model, a density model, an elasticity model, and/or other information related to seismic volume of interest 12 may be specified. In one embodiment, system 10 includes a source 14 and a set of seismic sensors 16.

In one embodiment, source 14 generates waves within the seismic volume of interest 12. As such, source 14 is a source of seismic wavefields that propagate through seismic volume of interest 12. Source 14 may generate seismic waves that enter the seismic volume of interest 12, and/or source 14 may physically impact the surface of seismic volume of interest 12 to generate the waves. For example, in one embodiment, source 14 includes explosives (e.g., dynamite/Tovex), a specialized air gun, a Vibroseis, and/or other sources.

Seismic sensors 16 are configured to detect seismic wavefields. For example, seismic sensors 16 may include seismometers that generate time varying signals that indicate motion at the surface (or at some point within) seismic volume of interest 12. In the embodiment illustrated in FIG. 1, seismic sensors 16 are disposed on a surface of seismic volume of interest 12. However, this is not intended to be limiting, and in some embodiments, seismic sensors 16 may include instruments that detect subsurface seismic wavefields. Still further, in one embodiment, seismic sensors 16 include instruments disposed on a surface of a body of water located on top of seismic volume of interest 12, and detect wavefields that propagate up to seismic sensors 16 from an interface between a surface of seismic volume of interest 12 and the water. Seismic sensors 16 are typically disposed in a uniform and/or predetermined manner with respect to seismic volume of interest 12. For example, seismic sensors 16 may be disposed along a grid at the surface of seismic volume of interest. In another example, seismic sensors 16 may be disposed in the subsurface near and/or within the seismic volume of interest.

As can be seen in FIG. 1, in one embodiment, system 10 further comprises a storage module 18. Storage module 18 stores information related to the generation of seismic waves by source 14 and/or the detection of waves by seismic sensors 16. This information may include positional (and/or orientation) information related to one or both of source 14 and/or seismic sensors 16, information related to the waves generated by source 14 (e.g., frequency, phase, amplitude, etc.), information related to the time varying signals generated by individual ones of seismic sensors 16, (e.g., frequency, phase, amplitude, etc.), and/or other information.

In the embodiment illustrated in FIG. 1, storage module 18 includes a single centralized storage facility that is operatively linked with seismic sensors 16 and/or source 14. In this embodiment, the operative link between storage module 18, seismic sensors 16, and/or source 14 may be accomplished via electronic communication (e.g., wired communication, wireless communication, communication via a network, etc.). In some instances, the operative link between storage module 18 and seismic sensors 16 includes a set of removable electronic storage media that are disposed individually at each of seismic sensors 16 (or are each linked to a set of seismic sensors 16), and then are removed and transported to the centralized storage facility for storage and/or data transfer. It should be appreciated that the illustration of storage module 18 is not intended to be limiting. In one embodiment, storage module 18 may include a set of distributed storage facilities (e.g., disposed at individual seismic sensors 16).

Figure 2:
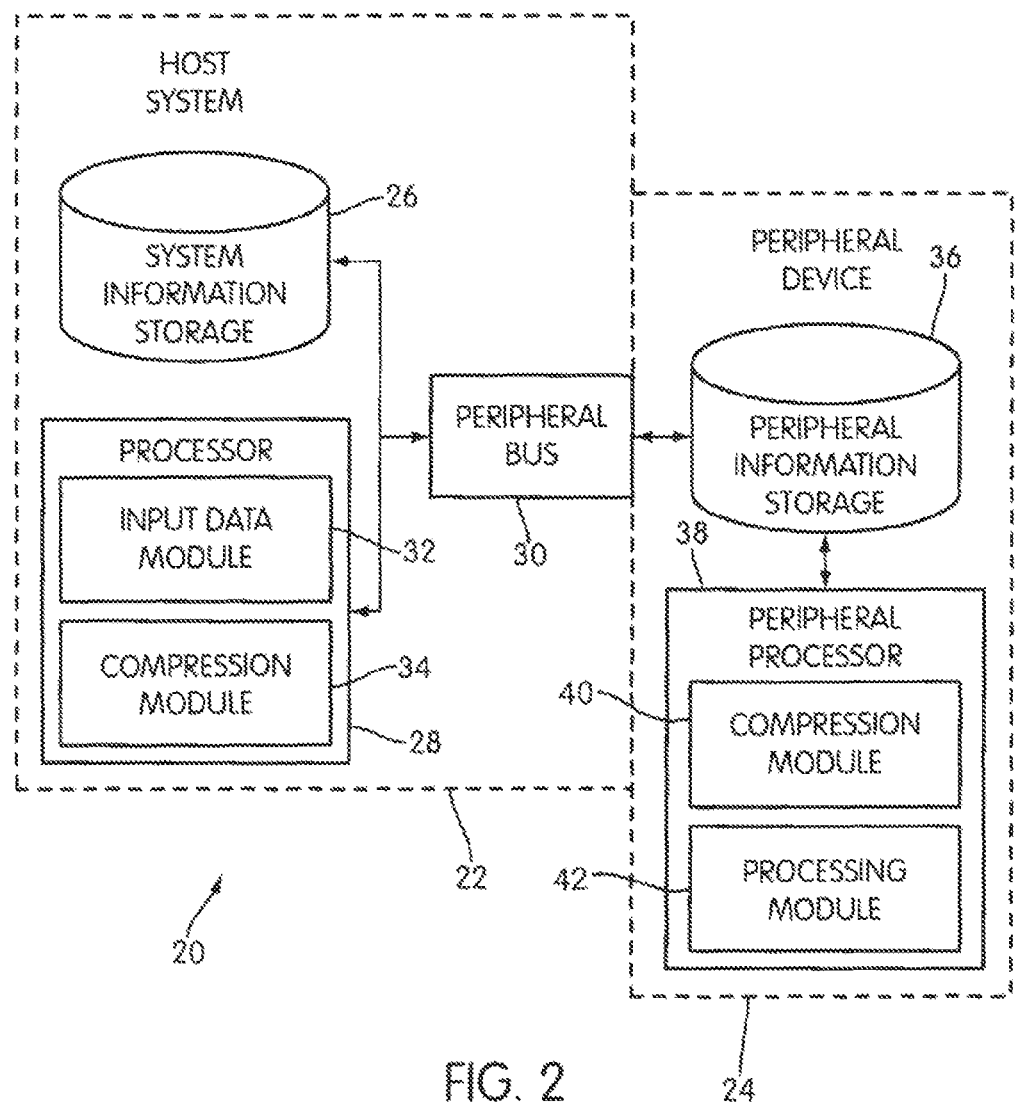
FIG. 2 illustrates a system configured to process data on a co-processor device (e.g. peripheral device) that is operatively coupled to a host computing system, according to one or more embodiments of the invention.

FIG. 2 illustrates a system 20 configured to determine information related to a seismic volume of interest. In one embodiment, the information determined by system 20 includes seismic wavefields within the seismic volume of interest at a given point in time during which seismic waves are present in the seismic volume of interest as a result of one or more seismic shots produced by a seismic source (e.g., source 14 shown in FIG. 1 and described above). As can be seen in FIG. 2, in one embodiment, system 20 includes host system 22 and a co-processor device such as peripheral device 24. In particular, system 20 enables the determination of the one or more seismic wavefields to be determined by peripheral device 24 in an enhanced manner (e.g., faster, with a smaller impact on the computing resources of host system 22, etc.).

Host system 22 represents a host computing system capable of electronically processing information according to predetermined algorithms. In some instances, host system 22 further manages the processing of information by resources outside of host system 22. For example, host system 22 may manage aspects of information processing performed on peripheral device 24 (e.g., by controlling information provided to peripheral device 24 and/or accepting output data from peripheral device 24), aspects of information processing performed by other host systems (e.g., in a client-server configuration, in a peer-to-peer configuration, etc.), and/or other processing of information outside host system 22. In one embodiment, host system 22 includes a system information storage 26, a processor 28, and a communications channel such as peripheral bus 30.

System information storage 26 includes one or more electronically readable storage media that enable information to be electronically stored by system information storage 26. The electronically readable storage media of system information storage 26 may include one or both of system storage that is provided integrally (i.e., substantially non-removable) with host system 22 and/or removable storage that is removably connectable to host system 20 via, for example, a port (e.g., a USB port, a firewire port, etc.) or a drive (e.g., a disk drive, etc.). System information storage 26 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. System information storage 26 may store software algorithms, information related to an output generated by an electronic display associated with host system 20 (not shown), information determined by processor 28, information transmitted to and/or received from peripheral device 24, and/or other information that enables host system 22 to process information and/or manage the processing of information properly. System information storage 26 may be a separate component within host system 22, or system information storage 26 may be provided integrally in the same device(s) as processor 28 (e.g., in a desktop or laptop computer).

Processor 28 is configured to provide information processing capabilities in host system 22. As such, processor 28 may include one or more of a digital processor, an analog processor, a digital circuit designed to process information, an analog circuit designed to process information, a state machine, and/or other mechanisms for electronically processing information. Although processor 28 is shown in FIG. 2 as a single entity, this is for illustrative purposes only. In some implementations, processor 28 may include a plurality of processing units. These processing units may be physically located within the same device, or processor 28 may represent processing functionality of a plurality of devices operating in coordination to provide the functionality of host system 22.

As is shown in FIG. 2, in one embodiment, processor 28 includes an input data module 32, and a compression module 34. Modules 32 and 34 may be implemented in software; hardware; firmware; some combination of software, hardware, and/or firmware; and/or otherwise implemented. It should be appreciated that although modules 32 and 34 are illustrated in FIG. 2 as being co-located within a single processing unit, in implementations in which processor 28 includes multiple processing units, modules 32 and/or 34 may be located remotely from the other modules.

As was mentioned above, system 20 may, in some instances, be configured to determine information related to a seismic volume of interest. In order to determine such information, processor 28 may manage processing of information by peripheral device 24. Information may be processed on peripheral device 24, for example, to free the computing resources (e.g., system information storage 26 and/or processor 28) for other processing activities, with an enhanced efficiency (e.g., where peripheral device 24 is configured to perform a certain type of processing more efficiently than processor 28), and/or for other reasons. The determination of information related to the seismic volume of interest by peripheral device 24 may include a determination of a complete set of output data. For example, a complete set of output data may include one or more seismic wavefields within the seismic volume of interest at a given point in time during which seismic waves are present in the seismic volume of interest as a result of one or more seismic shots produced by a seismic source (e.g., source 14 shown in FIG. 1 and described above). Other complete sets of output data are also contemplated.

In order to enable peripheral device 24 to perform processing involved in a determination of a complete set of output data related to a seismic volume of interest, input data module 32 may identify a set of input data that will be needed by peripheral device 24 to determine the set of output data. For example, where the set of output data will include one or more seismic wavefields within the seismic volume of interest at a given point in time during which seismic waves are present in the seismic volume of interest as a result of one or more seismic shots produced by a seismic source, the set of input data needed to determine this set of output data will include one or more complete models of the seismic volume of interest (e.g., a velocity model, a density model, an elasticity model, etc.), readings taken by an array of seismic sensors that each generated time-varying data while waves caused by at least one seismic shot were propagating through the seismic volume of interest, and/or information (e.g., waveform(s), etc.) describing the at least one seismic shot introduced into the seismic volume of interest. The data identified by input data module 32 may include data previously stored on system information storage 26.

Compression module 34 is configured to compress input data prior to transmission to peripheral device 24. The compression of input data by compression module 34 may take place immediately prior to the transmission of the compressed input data to peripheral device 24, or the input data may be compressed by compression module 34 and stored to system information storage 26, prior to being transmitted from system information storage 26 to peripheral device 24, in its compressed form. The compression of the input data tends to enhance various aspects of the operation of system 20. For example, the transmission of compressed input data from host system 22 to peripheral device 24 effectively increases the rate of transfer of the information being transmitted (e.g., increased by the compression factor). This may remove a system bottleneck caused by a limited rate of information transfer between processor 28 and peripheral device 24, particularly for transmissions of relatively large amounts of input data. As another example, the transmission of the input data in a compressed form tends to increase the amount of data that can be stored to peripheral device 24. Other enhancements may be realized through the transmission of compressed input data from host system 22 to peripheral device 24.

As was mentioned above, from the input data received from host system 22, peripheral device 24 generates a set of output data. In one embodiment, the set of output data includes one or more seismic wavefields within a seismic volume of interest at a given point in time during which seismic waves are present in the seismic volume of interest as a result of one or more seismic shots produced by a seismic source. The set of output data is transmitted from peripheral device 24 to host system 22. In one embodiment, the set of output data received by host system 22 from peripheral device 24 is compressed (e.g., according to the compression implemented on the input data prior to transmission). In this embodiment, compression module 34 decompresses the output data. For example, compression module 34 may decompress the output data as it is received from peripheral device 24, and/or the output data may first be stored (e.g., to system information storage 26), and then decompressed by compression module 34 some time after receipt from peripheral device 24.

In one embodiment, the compression algorithms implemented by compression module 34 to compress and/or decompress input data and/or output data compress data by a compression factor of between about 2 and about 200. In one embodiment, the compression algorithms implemented by compression module 34 to compress and/or decompress input data and/or output data compress data by a compression factor of between about 10 and about 100. For example, the compression algorithms may include representing input data and/or output data with word formats for fixed or floating point numbers that are shorter than 32 bits per sample. As another example, the compression algorithms may include transform-based compression, such as the wavelet transforms described in U.S. Pat. No. 5,745,392 entitled "Method for Reducing Data Storage and Transmission Requirements for Seismic Data," issued Apr. 28, 1998, the contents of which are incorporated by reference into this disclosure in their entirety. The compression factor may be selected such that computations performed on peripheral device 24 become "computation bound" (e.g., bound by the computation speed provided by processor(s) present in host system 22 and/or peripheral device 24) instead of "I/O bound" (e.g., bound by the time required for the input and/or output of data sets that must be communicated between and/or stored in the various components of system 20, which is alleviated through compression).

Peripheral bus 30 is configured to enable the transmission of information back and forth between host system 22 and peripheral device 24. In one embodiment, peripheral bus 30 comprises a Peripheral Component Interconnect ("PCI") bus, or a similar peripheral bus (e.g., PCIe, PCI-X, PCIe-2.0, PCIe-3.0, HTX, etc.) that provides a connection between host system 22 and peripheral device 24. In this embodiment, peripheral bus 30 may include a socket provided on and/or connected to a motherboard associated with host system 22, and/or peripheral bus 30 may be formed as a permanent connection between host system 22 and a peripheral device that is integrally formed with host system 22 (e.g., as an integrated circuit fitted onto a motherboard of host system 22). In one embodiment, peripheral bus 30 comprises some other port and/or communications channel that implements another method for connecting a peripheral device with host system 22 such as Infiniband, Ethernet, Fibre Channel, Interlaken, or any specialized point-to-point protocol. These examples are not meant to be limiting; other communications channels fall within the scope of this invention. Additionally, data may pass over multiple types of communication channels between the main processor and the peripheral device. For example, it could pass from the main processor memory to a network adapter via a peripheral bus (e.g. PCI Express), from the network adapter to the remote endpoint via a network bus (e.g. Infiniband) and then from the remote endpoint network adapter to the peripheral device via a peripheral bus (e.g. PCI Express). Other combinations of communication channels and additional devices between the host system and the peripheral device are possible and fall within the scope of this invention.

As has been stated briefly above, peripheral device 24 is configured to receive input data from host system 22, process the input data in accordance with one or more predetermined algorithms to generate a complete set of output data, and transmit the output data back to host system 22. As used herein, the term "co-processor device" or "peripheral device" may include any device that is connected directly to host system 22 to expand the functionality and/or capabilities of host system 22. For example, in one embodiment, peripheral device 24 includes an expansion card that is connected with host system 22 via peripheral bus 30. The co-processor device may be located within the same chassis as the host system or remotely from the host system. In one embodiment, peripheral device 24 comprises a peripheral information storage 36 and a peripheral processor 38 and, equivalently, a co-processor device comprises a co-processor information storage and a co-processor.

The co-processor device may have co-processor information storage, such as peripheral information storage 36 which includes an electronically readable storage medium that enables the storage of information (e.g., input data, output data, etc.) on peripheral device 24. Where peripheral device 24 is formed as a peripheral card, this storage medium typically includes electrical charge-based storage media (e.g., EEPROM, RAM, etc.), and/or solid-state storage media (e.g., flash drive, etc.), however, other electronically readable storage media are contemplated. While system 20 may be formed such that input data and/or output data may be stored to peripheral information storage 36 in a compressed form, peripheral information storage 36 may not typically include processing resources for compressing/decompressing information. Instead, peripheral information storage may generally be configured to merely store information in the form in which it is received (e.g., a compressed form).

In conventional peripheral devices, particularly peripheral card devices, the included peripheral information storage tends to be relatively small. For example, less than about 1 Gigabyte. As another example, less than about 4 Gigabytes. As still another example, less than about 6 Gigabytes. By contrast, peripheral information storage 36 is relatively large. For example, peripheral information storage 36 may be greater than or equal to about 24 Gigabytes. As another example, peripheral information storage 36 may be greater than or equal to about 48 Gigabytes. As yet another example, peripheral information storage 36 may be greater than or equal to about 96 Gigabytes. These numbers represent the current state of conventional peripheral devices and peripheral information storage 36; these numbers are for comparison of relative sizes only and are not meant to be limiting. The enhanced size of peripheral information storage 36 may enable a relatively large amount of information to be held on peripheral device 24. As will be discussed further below, in one embodiment, the size of peripheral information storage 36 may be such that peripheral device 24 holds enough compressed input data to enable peripheral device 24 to perform an entire processing operation without limiting the speed of the processing operation in waiting for additional information (e.g., additional input data) from host system 22.

Since the communication of information from host system 22 to peripheral device 24 over peripheral bus 30 may act as a bottleneck in the processing of information on peripheral device 24 (e.g., peripheral device 24 is capable of processing information at a substantially greater rate than information can be communicated between peripheral device 24 and host system 22 over peripheral bus 30), holding enough of the compressed input data required to perform an entire processing operation on peripheral information storage 36 such that the communication of amounts of additional compressed input data not initially stored on peripheral information storage 36 does not limit the speed at which the processing operation is performed. This may enhance the speed at which the processing operation can be performed by peripheral device 24. In some implementations, the compressed data stored in peripheral information storage 36 may include all of the input data required for the processing operation. In some implementations, the compressed input data stored in peripheral information storage 36 may include substantially all of the input data required for the processing operation such that reduction in speed of the processing operation caused by the communication of additional input data required for the processing operation will be de minimis.

As used herein, the term "entire processing operation" may refer to a processing pass through an entire input data set, including all of the inner loops within the processing. For example, in one embodiment, an entire processing operation may include determining one or more seismic wavefields within a seismic volume of interest at a given point in time during which seismic waves are present in the seismic volume of interest as a result of one or more seismic shots produced by a seismic source. In order to facilitate this processing without requiring substantial requests for data from host system 22 during the operation, peripheral information storage 36 may be configured to hold all (or substantially all) of one or more of at least one complete model of a seismic volume of interest, a complete set of readings of at least one seismic shot within the seismic volume of interest (e.g., a single shot, one or more common offset cubes, one or more common midpoint gather, one or more common receiver gather, etc.) taken by an array of seismic sensors that each generated time-varying data during the at least one seismic shot, and/or wavelets that represent seismic waves introduced into the seismic volume of interest during the at least one seismic shot by a seismic source.

Where peripheral information storage 36 holds substantially all, but not entirely all, of the entire set of input data, input data module 32 of processor 28 may be configured to determine how much of the entire set of input data may be excluded from storage within peripheral information storage 36 initially (and communicated via peripheral bus 30 during computation) without interfering significantly with the speed of the computation. This determination may be dynamic (e.g., based on conditions within system 20 and/or the specific computation to be performed) and/or static (e.g., a predetermined percentage of the overall set of input data). Where the determination is dynamic, input data module 32 may determine the portion of the entire set of input data to be excluded from storage within peripheral information storage initially based on one or more of a data transfer rate over peripheral bus 30, a compression factor of the input data, a size of the entire input data set, a computational speed of peripheral device 24, a complexity of the computation to be performed on the set of input data, and/or other factors.

Peripheral processor 38 is configured to provide information processing capabilities in peripheral device 24. As such, peripheral processor may include one or more of a digital processor, an analog processor, a digital circuit designed to process information, an analog circuit designed to process information, a state machine, and/or other mechanisms for electronically processing information. Although processor 28 is shown in FIG. 2 as a single entity, this is for illustrative purposes only. In some implementations, processor 28 may include a plurality of processing units.

In one embodiment, peripheral processor 38 includes a Field-Programmable Gate Array ("FPGA"). An FPGA is a semiconductor device containing programmable logic components called "logic cells" (e.g., flip-flops) and/or "logic blocks" (e.g., multiplication or memory blocks), and programmable interconnects there between. Logic cells and/or blocks can be programmed to perform the function of basic logic gates such as AND, and XOR, or more complex combinational functions such as decoders or mathematical functions. A network of programmable interconnects allow logic cells and/or blocks to be interconnected as needed by the system designer, somewhat like a one-chip programmable breadboard. Logic cells and/or blocks and interconnects can be programmed by the customer or designer, after the FPGA is manufactured, to implement any logical function—hence the name "field-programmable".

FPGA's may enhance processing (e.g., speed, power consumption, etc.) in repetitively processing large data sets with respect to the processing capabilities of other less specialized processors (e.g., processor 28). In fact, this enhanced efficiency provides an impetus for processing input data on peripheral device 24 in some instances. For example, where peripheral device 24 is implemented to generate one or more seismic wavefields within a seismic volume of interest at a given point in time during which seismic waves are present in the seismic volume of interest as a result of one or more seismic shots produced by a seismic source, an FPGA may provide an enhanced speed for the requisite processing, in addition to alleviating the processing load on processor 28.

In one embodiment, peripheral processor 38 may include one or more of a compression module 40, a processing module 42, and/or other modules. Modules 40 and 42 may be implemented in software; hardware; firmware; some combination of software, hardware, and/or firmware; and/or otherwise implemented.

As has been mentioned above, in one embodiment, input data is transmitted to peripheral device 24 and stored on peripheral information storage 36 in a compressed form. Compression module 40 is configured to decompress input data stored on peripheral information storage 36. In addition to enabling the storage of compressed input data on peripheral information storage 36 (thereby increasing the amount of input data that can be stored on peripheral information storage 36), the ability of compression module 40 to decompress input data on peripheral processor 38 further increases the rate at which information is transferred in peripheral device 24 (by the compression factor). Since the transmission of information between peripheral information storage 36 and peripheral processor 38 can present a bottleneck in the processing of information on peripheral device 24, the enhancement in the rate of information transfer realized by transmitting compressed input data to peripheral processor 38 from peripheral information storage 36 may provide a significant increases in processing efficiency (e.g., time savings, etc.) on peripheral device 24. In some implementations, the communication of compressed information between peripheral information storage 36 and peripheral processor 38 may transform processes that are I/O bound (e.g., bound by the amount of time required to communicate the requisite information through the bottleneck between these components) to processes that are computation bound (e.g., bound by the computational power provided by peripheral processor 38).

Processing module 42 may process the input data that is decompressed by compression module 40 to generate output data. For example, where the output data generated includes one or more seismic wavefields within a seismic volume of interest at a given point in time during which seismic waves are present in the seismic volume of interest as a result of one or more seismic shots produced by a seismic source, processing module 42 may include imaging or seismic processing algorithms.

Once output data has been generated by processing module 42, compression module 40 then compresses the output data. The output data may be compressed according to compression algorithms that are the same, or similar, to the compression algorithms used to compress the input data. Compression of the output data may provide one or more of several enhancements to system 20. For example, compression of the output data on peripheral processor 38 may enhance the rate at which the output data is transferred from peripheral processor 38 to peripheral information storage 36, the rate at which output data is transferred from peripheral device 24 to host system 22 over peripheral bus 30, and/or the amount of output data that can be stored in peripheral information storage 36.

In the embodiment in which peripheral processor 38 comprises an FPGA, input data is received by peripheral processor 38, and flows through the logic blocks of peripheral processor 38 according to the interconnects established for a predetermined computation. More specifically, compressed input data is first provided to the logic blocks associated with compression module 40 for decompression, then is routed through the logic blocks associated with processing module 42 to generate output data, and then the output data is routed through the logic blocks associated with compression module 40 to compress the output data for transmission to peripheral information storage 36. From peripheral information storage 36, the compressed output data is transferred to host system 22.

Figure 3:
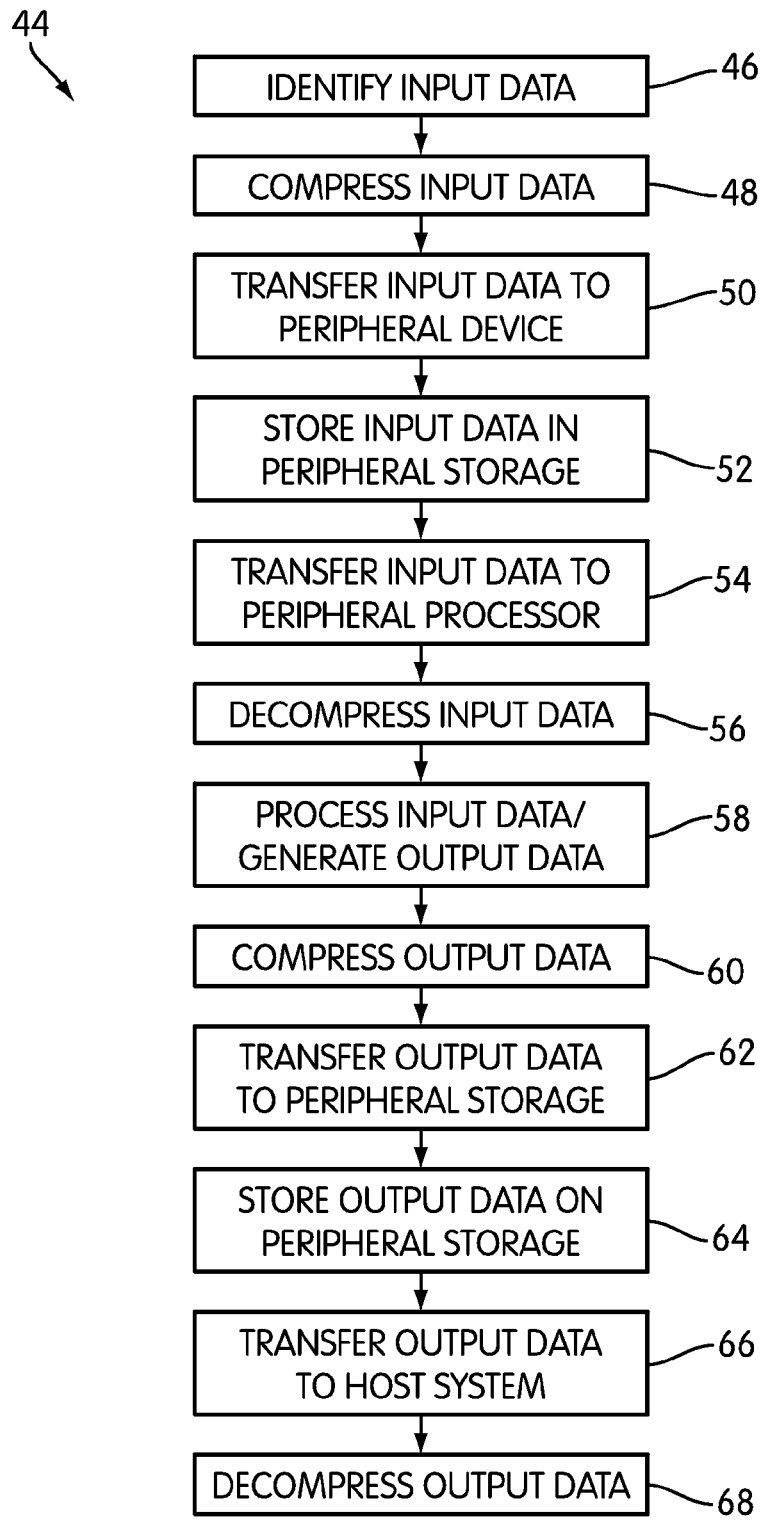
FIG. 3 illustrates a method of processing data on a co-processor device (e.g. peripheral device) that is operatively coupled to a host computing system, in accordance with one or more embodiments of the invention.

FIG. 3 illustrates a method 44 of processing data on a peripheral device that is operatively coupled to a host computing system via a peripheral bus. Although the operations of method 44 are discussed below with respect to the components of system 20 described above and illustrated in FIG. 2, it should be appreciated that this is for illustrative purposes only, and that method 44 may be implemented with alternative components and/or systems without departing from the scope of this disclosure. Further, the operations of method 44 presented below are intended to be illustrative. In some embodiments, method 44 may be accomplished with one or more additional operations not described, and/or without one or more of the operations discussed. Additionally, the order in which the operations of method 44 are illustrated in FIG. 3 and described below is not intended to be limiting.

At an operation 46, input data to be processed is identified. The input data includes a complete set of input data that will enable an entire processing operation to be performed. In some instances, the entire processing operation may include determining information related to a seismic volume of interest. For example, the information related to the seismic volume of interest may include one or more seismic wavefields within the seismic volume of interest at a given point in time during which seismic waves are present in the seismic volume of interest as a result of one or more seismic shots produced by a seismic source. In such instances, the complete set of input data may include one or more of one or more complete models of the seismic volume of interest (e.g., a velocity model, a density model, an elasticity model, etc.), readings taken by an array of seismic sensors that each generated time-varying data while waves caused by at least one seismic shot were propagating through the seismic volume of interest, and/or information (e.g., waveform(s), etc.) describing the at least one seismic shot introduced into the seismic volume of interest. In one embodiment, operation 46 is performed by an input data module of the host computing system that is the same as, or similar to, input data module 32 (shown in FIG. 2 and described above).

At an operation 48, input data identified at operation 46 is compressed. In one embodiment, operation 48 is performed by a compression module of the host computing system that is the same as, or similar to, compression module 34 (shown in FIG. 2 and described above).

At an operation 50, the compressed input data is transferred from the host computing system to the peripheral device over the peripheral bus. As such, operation 50 includes the transmission of the compressed input data by the host computing system and the reception of the compressed input data by the peripheral device.

At an operation 52, the compressed input data is stored on the peripheral device. The set of input data stored simultaneously on the peripheral device at operation 52, in one embodiment, comprises an entire set of input data that enables an entire processing operation to be performed on the input data with a reduced, or eliminated, requirement for reception of additional input data at the peripheral device to complete the entire processing operation. For example, in some instances, the entire set of input data includes one or more of one or more complete models of the seismic volume of interest (e.g., a velocity model, a density model, an elasticity model, etc.), readings taken by an array of seismic sensors that each generated time-varying data while waves caused by at least one seismic shot were propagating through the seismic volume of interest, and/or information (e.g., coefficient(s), etc.) describing the at least one seismic shot introduced into the seismic volume of interest. In one embodiment, operation 52 comprises the storage of the entire set of input data to a peripheral information storage formed on the peripheral device that is the same as, or similar to, peripheral information storage 36 (shown in FIG. 2 and described above).

At an operation 54, the compressed input data is transferred within the peripheral device from the peripheral storage to a peripheral processor formed on the peripheral device. As such, operation 54 includes the transmission of compressed input data from the peripheral information storage, and the receipt of compressed input data by the peripheral processor. In one embodiment, the peripheral processor is the same as, or similar to, peripheral processor 38 (shown in FIG. 2 and described above).

At an operation 56, the peripheral processor decompresses the received input data. In one embodiment, operation 56 is performed by a compression module that is the same as, or similar to, compression module 40 (shown in FIG. 2 and described above).

At an operation 58, decompressed input data is processed in accordance with one or more predetermined algorithms to generate output data. In one embodiment, operation 58 is performed by a processing module that is the same as, or similar to, processing module 42 (shown in FIG. 2 and described above). It should be appreciated that in some instances, operation 58 may be implemented as a hybrid of operations 56 and 58 above, wherein compressed (or partially compressed) input data may be processed without decompression (or complete decompression).

At an operation 60, the peripheral processor compresses the output data generated at operation 58. In one embodiment, operation 60 is performed by the compression module that performed operation 56.

At an operation 62, the compressed output data is transferred from the peripheral processor to the peripheral information storage. As such, operation 62 includes the transmission of the compressed output data from the peripheral processor, and the reception of the compressed output data by the peripheral information storage.

At an operation 64, the compressed output data is stored on the peripheral device. In one embodiment, the compressed output data is stored on the peripheral information storage.

At an operation 66, the compressed output data is transferred from the peripheral device to the host computing system via the peripheral bus. As such, operation 66 comprises the transmission of the compressed output data from the peripheral device, and the receipt of the compressed output data at the host computing system.

At an operation 68, the compressed output data is decompressed on the host computing system. In one embodiment, operation 68 is performed by the compression module that performed operation 48.

It should be appreciated that the description of system 20 and method 44 in the context of determining information related to a seismic volume of interest has been provided herein merely for illustrative purposes. This disclosure includes within its scope other embodiments in which the management and transmission of compressed information within and between a host computing system and a peripheral device in the manner described herein enhances the efficiency of processing managed by the host computing system on the peripheral device. Such enhancements in the processing efficiency may be a result of one or more of increasing the effective rate of data transferred between the host computing system and the peripheral device, increasing effective storage space for input data on the peripheral device (thereby reducing and/or eliminating the need for the peripheral device to receive input data in an ongoing manner during data processing), and/or increasing the effective rate of data transferred within the peripheral device between storage and processing.

Figure 4:
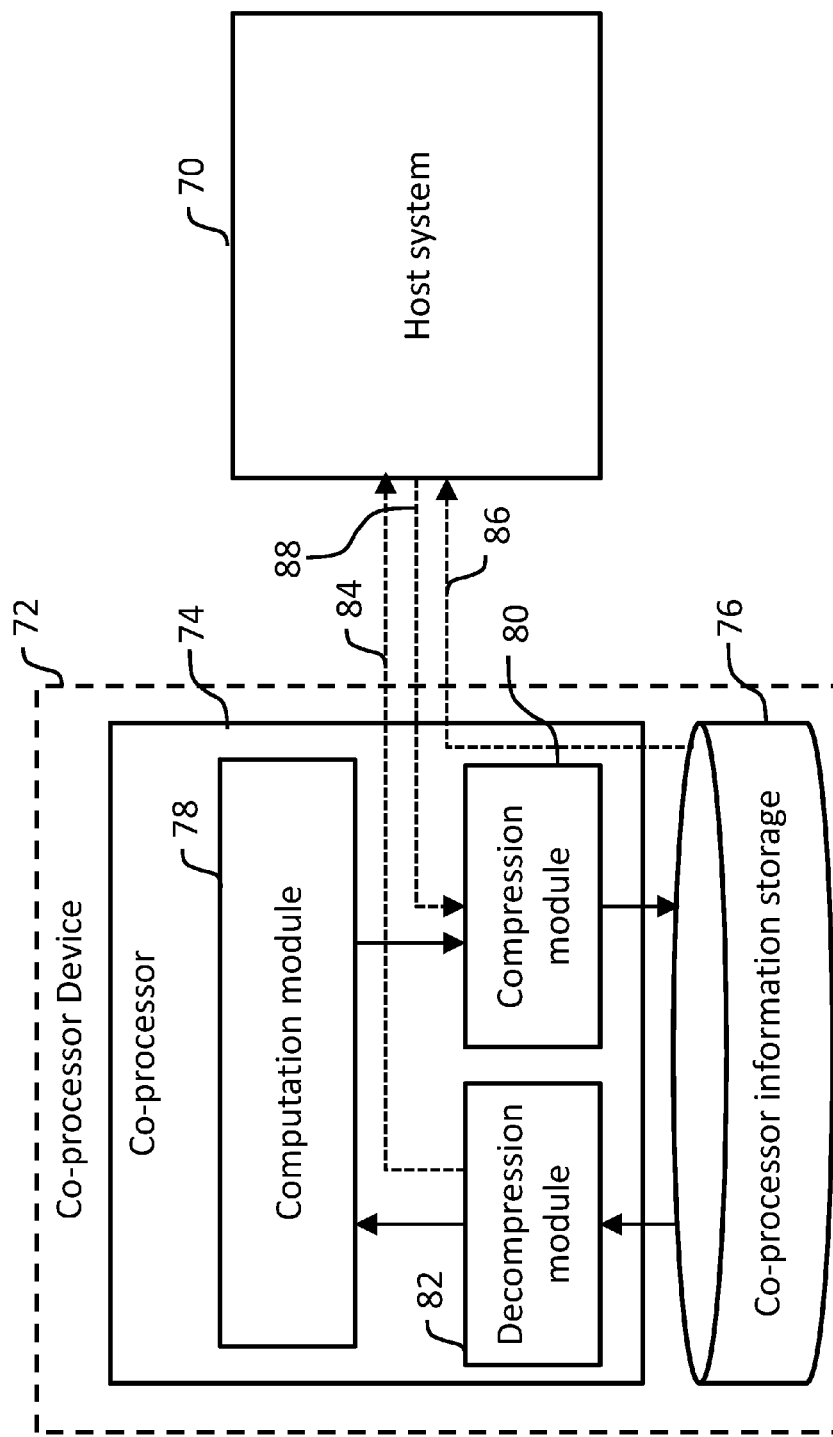
FIG. 4 illustrates a system configured to process data on a co-processor device that is operatively coupled to a host computing system, according to one or more embodiments of the invention.
Figure 6:
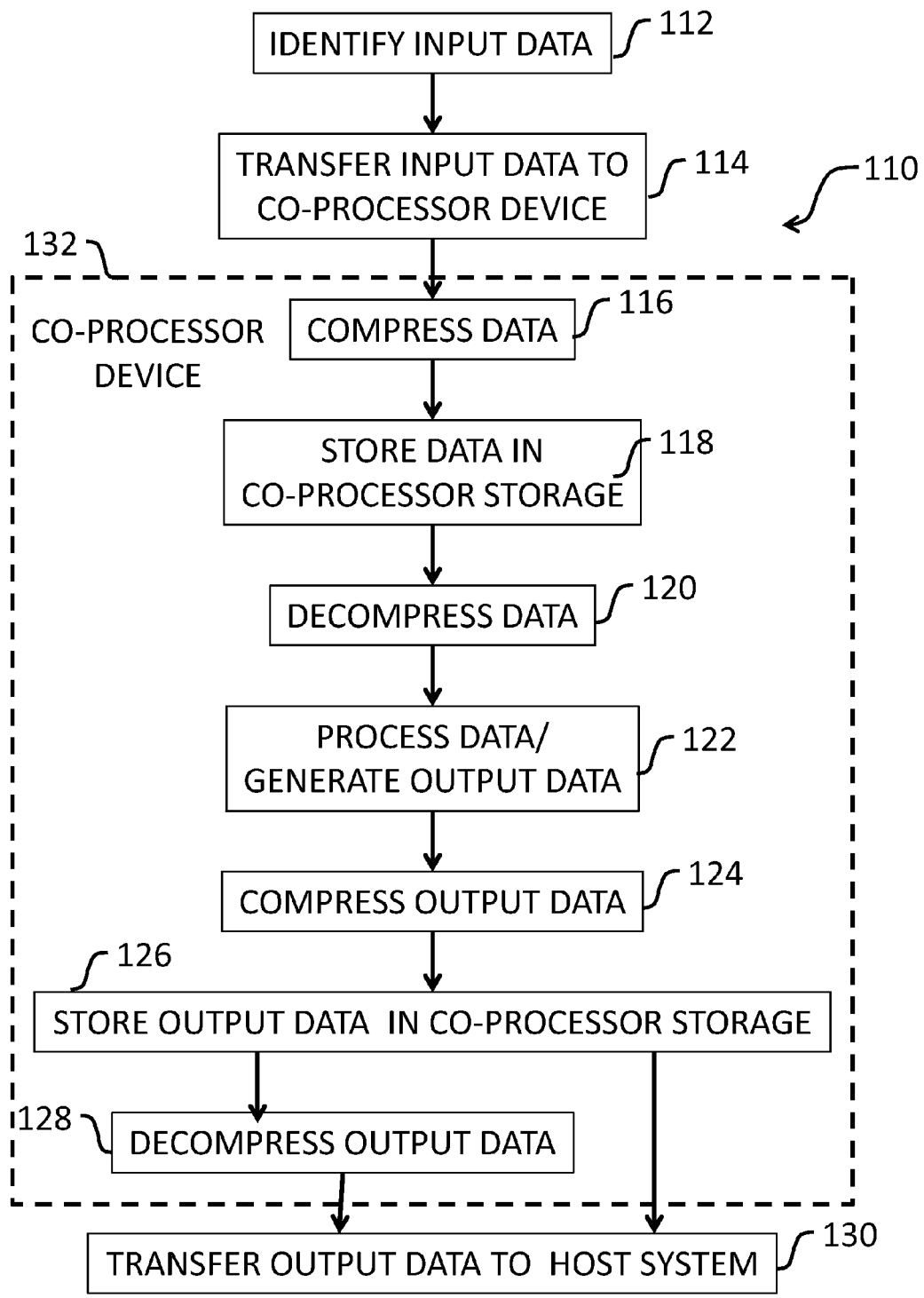
FIG. 6 illustrates a method of processing data on a co-processor device that is operatively coupled to a host computing system, in accordance with one or more embodiments of the invention.

Another embodiment of the invention is illustrated in FIG. 4 and FIG. 6. In this embodiment, the bottleneck is not between the host computer system and the co-processor device but rather between the co-processor and the co-processor information storage. In method 110 of FIG. 6, the input data is identified by the host computer system at operation 112. The host system 70 in FIG. 4 then transfers the input data through a communications channel 88 to co-processor device 72 at operation 114 without compressing the data first. When the co-processor 74 receives the input data, it executes compression module 80 to compress the data at operation 116 and stores it on the co-processor information storage 76 at operation 118. When the co-processor device 72 enters a computation phase, it reads the compressed data from its co-processor information storage 76 into its co-processor 74 and decompresses it at operation 120. The decompression module 82 transforms the compressed data into a format suitable for computation by the computation module 78, which processes the data to generate output data as at operation 122. The decompression module may decompress all or part of the data and may decompress it into a format that is the same as the original input data from the host system 70 or into a different format that is suitable for the computation module 78. After the co-processor 74 has completed all or part of the processing at operation 122, the output data is compressed by compression module 80 at operation 124 and stored on co-processor information storage device 76 at operation 126. The compression module 80 for the output data at operation 124 may be different from the compression module 80 for the input data at operation 116. The co-processor information storage device 76 for the compressed output data at operation 126 may be different from the co-processor information storage device 76 for the compressed input data at operation 118. The output data may be transferred to the host system 70 at operation 130 as either compressed output data by communications channel 86 or decompressed output data which is decompressed by the decompression module 82 on the co-processor 74 then transferred through the communications channel 84. The communications channels 84, 86, and 88 may all be the same devices or different devices and may be, by way of example and not limitation, one or more of a PCI bus, a PCIe bus, a PCI-X bus, a PCIe-2.0 bus, a PCIe-3.0 bus, an HTX bus, Infiniband, Ethernet, Fibre Channel, Interlaken or any specialized point-to-point protocol. In the method 110 of FIG. 6, the co-processor device 132 may perform operations 116-128.

Figure 5:
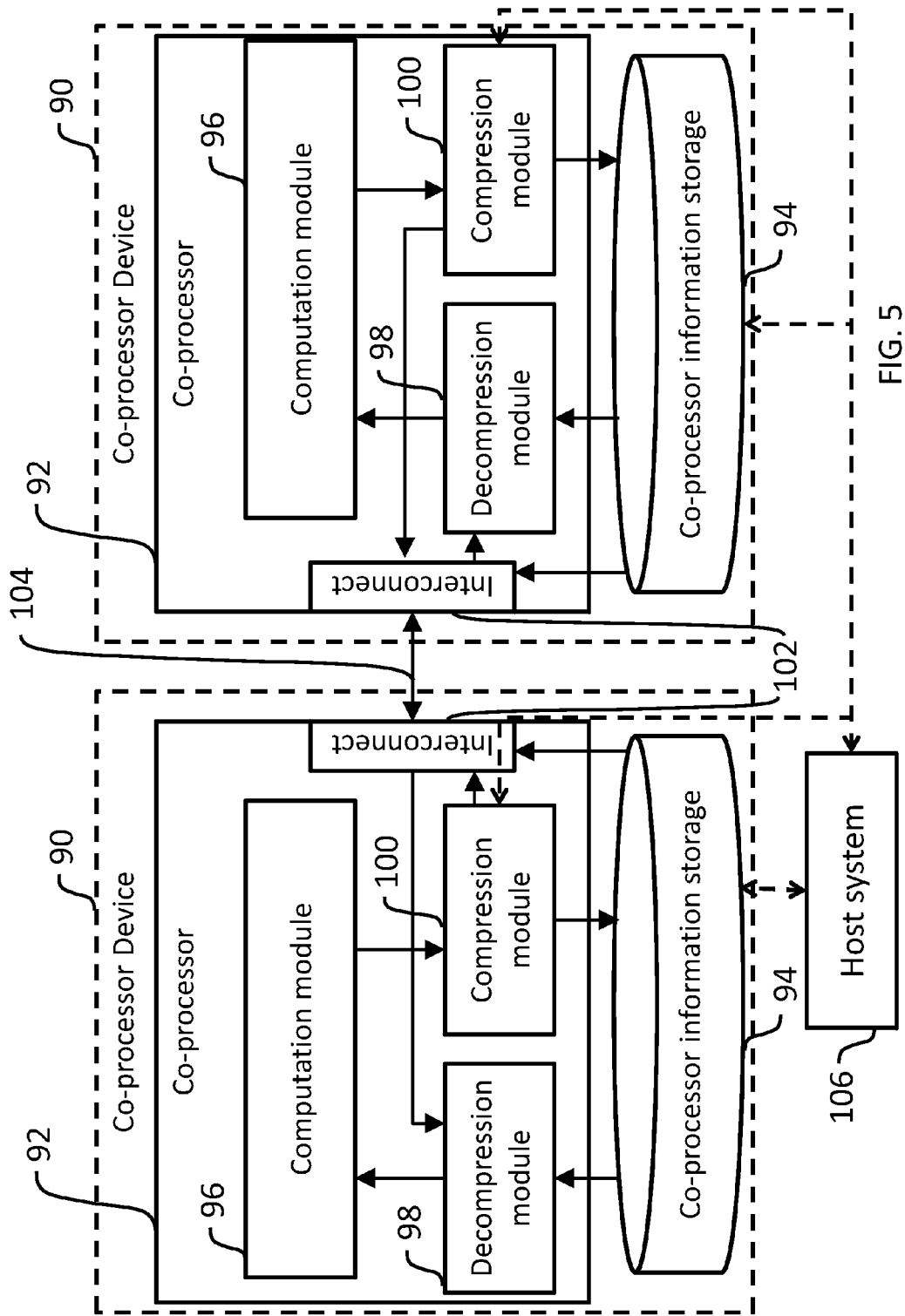
FIG. 5 illustrates a system configured to use a plurality of co-processor devices, according to one or more embodiments of the invention.

In yet another embodiment, the systems illustrated in FIG. 2 and FIG. 4 may include more than one co-processor device. These devices may be connected directly to the host system, as co-processor device 24 is connected to host system 22 and co-processor device 72 is connected to host system 70 and/or the co-processor devices may be connected to each other. FIG. 5 illustrates a system wherein multiple co-processor devices 90 are linked to each other. The host system 106 may be connected to one or multiple co-processor devices through one or more communications channels, which may link to one or more of the co-processor information storages 94 and/or one or more of the co-processors 92 at the compression modules 100. In this example, each of the co-processor devices 90 contain a co-processor 92 capable of executing the decompression modules 98, compression modules 100, and computation modules 96. These modules may perform processing operations similar to those performed by the like-named modules previously described in FIG. 4. In FIG. 5, the co-processor devices 90 also have interconnect device 102. These interconnect devices 102 allow the co-processor devices to transfer information over a communications channel 104, which may be, for example, one or more of a PCI bus, a PCIe bus, a PCI-X bus, a PCIe-2.0 bus, a PCIe-3.0 bus, an HTX bus, Infiniband, Ethernet, Fibre Channel, Interlaken, or a specialized point-to-point protocol. The interconnect devices may be a switched interconnect (e.g. Ethernet, Infiniband, PCI Express) or a point-to-point interconnect (e.g. parallel data bus or high speed serial bus).

The system of FIG. 5 may be used when the computations performed on the input data need to be done on multiple co-processor devices that require information from each other in order to process the data. For example, in the computation of a timestep of a wave modeling calculation, wavefields are stored in a compressed format in memory, for example on the co-processor information storages 94. The problem domain is decomposed across several co-processor devices 90, each of which computes a block. To compute a timestep, each co-processor device 90 requires some data from adjacent devices. To compute, the compressed wavefields are loaded from the memories into the co-processors 92. The input data is passed through the decompression module 98 and into the computation module 96 to perform the computation. The computation module 96 may generate intermediate data or output data. Intermediate data may be sent through the interconnect device 102 by the communications channel 104 to adjacent co-processors in the compressed form (i.e. prior to passing through the decompression module). On arrival at the other co-processor, the intermediate data is decompressed 98 and passed to that co-processor's computation module 96. The computation module 96 may use the input data from its own co-processor information storage, its own intermediate data, and intermediate data transmitted to it from other co-processor devices to repeat processing steps until a complete set of output data has been determined Output data from the computation module 96 can be transferred to another co-processor 92 by passing it through a compression module 100 before transmitting it through the interconnect device 102 by the communications channel 104 and/or may be transmitted to the host system 106.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A method of processing data on a co-processor device that is operatively coupled to a host computing system via a communications channel, the method comprising:
    receiving a set of input data from the host computing system at the co-processor device over the communications channel, wherein the input data is received by the co-processor device over the communications channel in an uncompressed format, and wherein the set of input data comprises one or both of (i) one or more models of a seismic volume of interest, and/or (ii) a set of readings of at least one seismic shot within the seismic volume of interest taken by an array of seismic sensors that each generated time-varying data during the at least one seismic shot; compressing the input data on the co-processor device;
    storing all or substantially all of the set of compressed input data to a co-processor information storage contained within the co-processor device;
    transmitting at least a part of the input data included in the stored set of input data, in its compressed format, from the co-processor information storage to a co-processor included in the co-processor device;
    implementing the co-processor to process the part of the input data received from the co-processor information storage to determine a set of output data related to the presence of seismic waves in the seismic volume of interest; and
    transmitting the set of output data related to the presence of seismic waves in the seismic volume of interest to the co-processor information storage or the host computing system over the communications channel.

2. The method of claim 1 wherein implementing the co-processor comprises a decompression module and a computation module.

3. The method of claim 1 wherein transmitting the set of output data transmits a compressed set of output data or an uncompressed set of output data.

* * * * *